United States Patent [19]

Barkley

[11] Patent Number: 4,715,640

[45] Date of Patent: Dec. 29, 1987

[54] LOCATOR

[75] Inventor: Vincent P. Barkley, Arlington, Va.

[73] Assignee: Pace Incorporated, Laurel, Md.

[21] Appl. No.: 762,868

[22] Filed: Aug. 6, 1985

[51] Int. Cl.[4] ............................................. H05K 13/04
[52] U.S. Cl. .................................... 294/106; 294/104; 294/99.2; 294/99.1
[58] Field of Search ................ 294/106, 99.2, 96, 110, 294/818, 104, 115, 116, 99.1; 228/62; 219/30

[56] References Cited

U.S. PATENT DOCUMENTS

| | | | |
|---|---|---|---|
| 1,862,625 | 6/1932 | Kerr | 294/99.2 |
| 1,979,528 | 11/1934 | Bruce et al. | 294/99.2 |
| 2,936,365 | 5/1960 | Niemi | 294/99.2 |
| 3,465,621 | 9/1969 | Ladd | 294/99.2 |
| 3,881,607 | 5/1975 | Lewis | 294/106 |
| 4,569,550 | 2/1986 | Harigane et al. | 294/104 |

*Primary Examiner*—James B. Marbert
*Attorney, Agent, or Firm*—Gerald J. Ferguson, Jr.; Michael P. Hoffman; Ronni S. Malamud

[57] ABSTRACT

Locator device for locating modular electronic components centrally with respect to a nozzle of an apparatus for attaching the components to a substrate, such as a printed circuit board. The locator device comprises a component support member for supporting a component to be located centrally with respect to the nozzle of a component attachment apparatus, and a component centralizing element associated with the component support member and engageable with the nozzle for centralizing the component with respect to the nozzle prior to soldering of the component to the printed circuit board. When the component has been centralized with respect to the nozzle, the component is maintained in its centralized position by attachment to a source of vacuum disposed within the nozzle. This facilitates removal of the locator device from the nozzle to leave the component disposed centrally within the nozzle attached to the source of vacuum and ready for installation on the printed circuit board.

11 Claims, 5 Drawing Figures

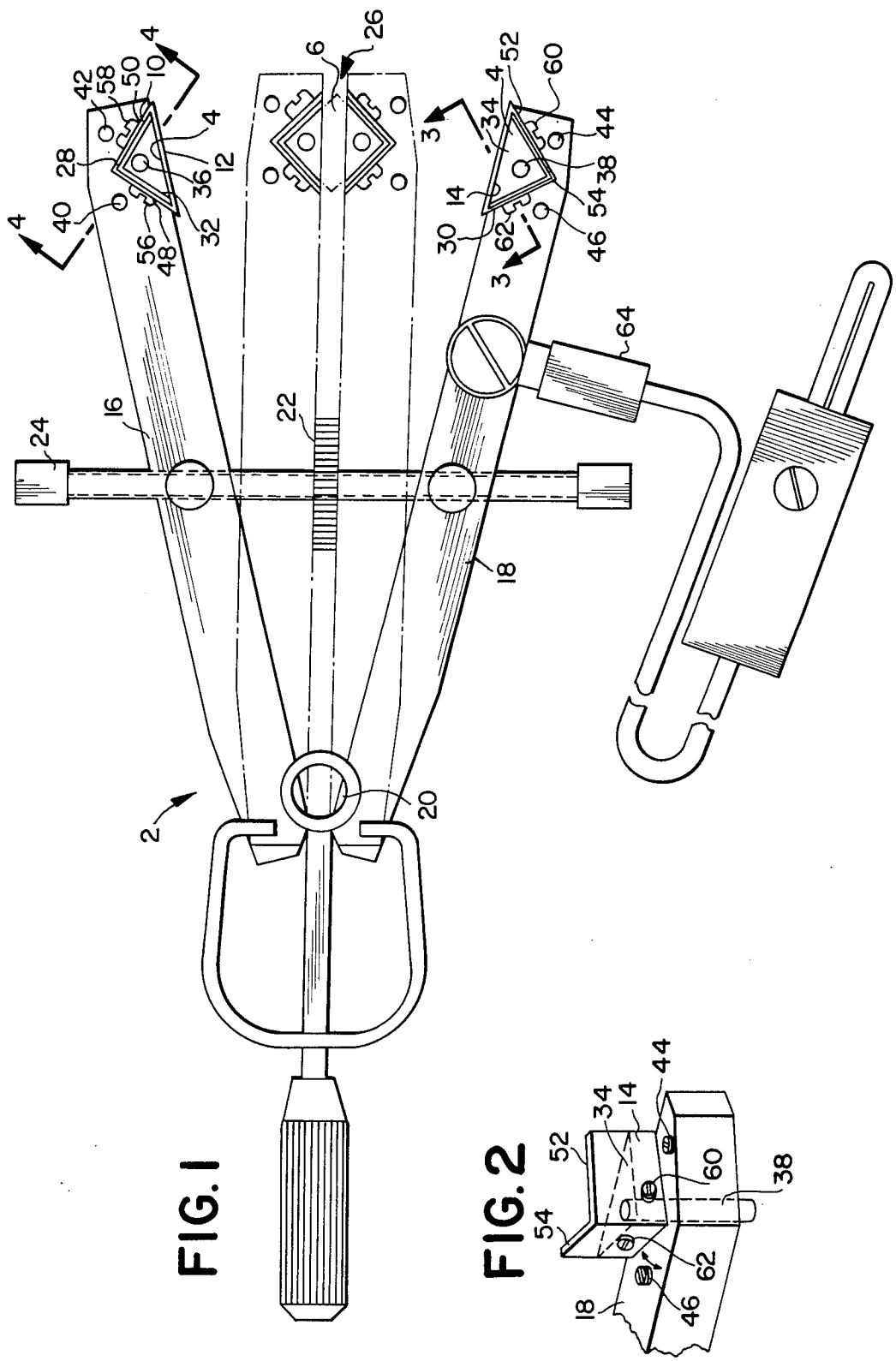

LOCATOR

The present invention relates to a locator device suitable for locating modular electronic components centrally with respect to a nozzle of an apparatus for attaching the components to a substrate such as a printed circuit board.

BACKGROUND OF THE INVENTION

Devices for installing (or removing) modular electronic components on a substrate such as a printed circuit board generally fall into two categories, namely those which use a heated head which contacts each of the terminals to melt the solder of the terminals, or those which use a blast of hot air to melt the solder. Due to the ever increasing miniaturization of electronic systems and individual components in them, difficulties are encountered in positioning the components with respect to the installation device in order to ensure that the terminals of the components are aligned with the terminals on the printed circuit board and also to ensure that all of the terminals are heated equally in order to obtain evenly formed connections without solder flowing between the terminals on the component and thus shorting them or otherwise damaging them. The positioning of components with respect to an installation device is usually carried out manually. In light of the difficulties which are encountered in accurately positioning the components with respect to the printed circuit board, especially small components, the procedure is frustrating and time consuming, and sometimes leads to incompletely formed connections and possibly damage to a component as well as surrounding components.

It is therefore a primary object of the present invention to provide a locator device for facilitating installation of electronic components on a substrate.

It is another object of the present invention to provide a locator device which includes a means for centralizing the component with respect to a nozzle of an apparatus for installing components on a printed circuit board.

BRIEF DESCRIPTION OF THE INVENTION

According to one aspect of the present invention, there is provided a locator device for locating modular electronic components centrally with respect to a nozzle of an apparatus for attaching such components to a substrate. The locator device comprises a component support means for supporting a component to be located centrally with respect to the nozzle of a component attachment apparatus, and a component centralizing means associated with the component support means and engageable with the nozzle for centralizing the component with respect to the nozzle.

In a preferred embodiment, the component support means includes first and second component support members mounted on respective support arms. The support arms are movable relative to each other between an open position and a closed position, and the support members in the closed position define a component supporting element which supports the component while it is being located centrally within the nozzle. In this preferred embodiment, the first and second support members each include at least one surface which is engageable with the nozzle for centralizing the component within the nozzle while it is supported by the support members.

BRIEF DESCRIPTION OF THE DRAWINGS

The invention of the present application will now be described in more detail with reference to preferred embodiments, given only by way of example, and with reference to the accompanying drawings, in which:

FIG. 1 is a plan view of a locator device of the invention;

FIG. 2 is a perspective view of one of the component support members mounted on one of the arms of the device of FIG. 1;

DETAILED DESCRIPTION OF THE INVENTION

Figure 3:
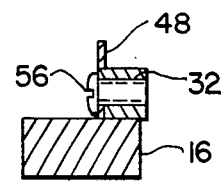
FIG. 3 is a cross-sectional view taken along the line 3—3 in FIG. 1.

The locator device of the present invention may be utilized for centrally locating components to be installed using the apparatus described and claimed in co-pending application Ser. No. 649,065 filed Sept. 10, 1984 and co-pending application Ser. No. 742,702, filed June 7, 1985. Those two applications relate to devices suitable for use in attaching modular electronic components (as well as removing them) to a substrate, and in light of this the entire disclosures of those two applications are hereby incorporated specifically by reference into the present application. The present locator device may also be employed with the nozzles described and claimed in the application executed by William J. Siegel and Vincent P. Barkley and entitled "Improved Nozzle Structure for Air Flow Soldering/Desoldering," Ser. No. 763,705, filed Aug. 8, 1985, now U.S. Pat. No. 4,626,205, as well as the application executed by William J. Siegel and Vincent P. Barkley relating to apparatus involving improved heat exchange devices, Ser. No. 762,869, filed Aug. 6, 1985, now U.S. Pat. No. 4,698,485. In light of this, the disclosures of those two further applications are also incorporated by reference into the present specification.

Referring now to the drawings, FIG. 1 shows a locator device of the present invention, generally referenced 2. The device comprises a component support means for supporting a component 6 to be located centrally with respect to a nozzle 8 (see FIG. 5) of a component attachment apparatus. A component centralizing means 10 is associated with the component support means 4 and engageable with the nozzle 8 for centralizing the component with respect to the nozzle.

As shown in FIG. 1, the component support means 4 includes support members 12, 14 mounted on support arms 16, 18. The support arms 16, 18, and thus the support members 12, 14 are movable relative to each other about a pivot point 20 between an open position shown in FIG. 1 in solid lines and a closed position shown in chain-dotted lines. The embodiment illustrated in FIG. 1 is constructed from a conventional screw compass, and the movement of the support arms 16, 18 between the open and closed positions is achieved by screwing the wheel 22 which rotates the threaded member 24 to effect movement of the arms 16, 18 towards or away from each other. When the support arms 16, 18 are in the closed position, the support members 12, 14 form a component supporting element 26 which supports the component while it is being centrally located within a nozzle (this is described in more detail below).

Figure 5:
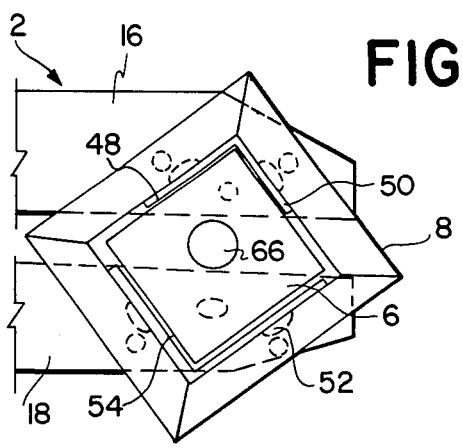
FIG. 5 is a plan view showing a component inserted within a nozzle with the device of FIG. 1.

Each support member includes at least one surface 28, 30 which is engageable with a nozzle for centralizing component within the nozzle. In the embodiment shown in FIG. 1, each support member 12, 14 comprises a triangular block 32, 34 which is pivotally mounted on the support arms 16, 18 by a pivot member 36, 38. The extent to which each triangular block 32, 34 pivots about the pivot members 36, 38 is limited by pivot limiting elements 40, 42, 44 46, against which the triangular blocks abut after pivoting through a total angle of about 15 to 30 degrees. The purpose of arranging the triangular blocks to be pivotable is to facilitate accommodation of the component, despite tolerance variations in the external dimensions of the component. In addition, this pivotability of the support members 12, 14 more readily facilitates location of the surfaces 28, 30 in contact with the nozzle, especially with the internal opposite corners of the nozzle, as shown in FIG. 5.

The surfaces 28, 30 are preferably comprised of upstanding plate members 48, 50, 52 and 54 which are each fixedly mounted to the triangular blocks 32, 34 by screws 56, 58, 60, 62.

FIG. 2 is a perspective view of part of the arm 18 showing the support member 14. The pivot limiting elements 44, 46 may be any upstanding abutments, for example grub screws.

FIG. 3 shows in cross-section, the plate member 48 attached to the triangular block 32 by means of screw 56.

Figure 4:
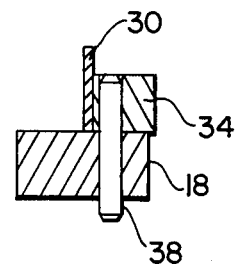
FIG. 4 is a cross-sectional view taken along the line 4—4 in FIG. 1.

FIG. 4 shows in cross-section the pivot member 38 about which the triangular block 34 pivots, as described above.

As a safety feature, attached to arm 18 is a grounding device 64 for preventing static charge from building up on the component 6. The nature of this device is not critical, and can be any appropriate grounding device.

FIG. 5 shows the installation of a component 6 within a nozzle 8 using the locator 2 of the invention. As will be seen, the plate members 48, 50, 52, 54 contact respective inner surfaces of the nozzle 8, and in this way the component 6 is centralized with respect to the nozzle. In this position, the nozzle is attached to a source of vacuum 66 extending down through the nozzle 8, and once the component has been attached to the vacuum source, the locator device is then removed by withdrawing the plate members 48, 50,52,54 downwardly from the component and away from the nozzle. As indicated earlier, the pivotability of the triangular blocks 32, 34 facilitates location of the plate members 48, 50 52, 54 within the nozzle, allowing for variations in symmetry of the nozzle, and this enables accurate centralization of the component with respect to the nozzle.

I claim:

1. A locator device for locating modular electronic components centrally with respect to a nozzle of an apparatus for attaching said components to a substrate, said locator device comprising:
   component support means for supporting a component to be located centrally with respect to the nozzle of a component attachment apparatus;
   component centralizing means associated with said component support means and engageable with said nozzle for centralizing said component with respect to said nozzle.

2. A locator device according to claim 1, wherein said component support means includes first and second support members which are movable relative to each other between an open position and a closed position, said support members in said closed position forming a component supporting element.

3. A locator device according to claim 2, wherein said first and second support members each includes at least one surface engageable with a nozzle for centralizing a component supported by said component supporting element with respect to said nozzle.

4. A locator device according to claim 3, wherein each component support member includes a component support surface, and said at least one surface of each component support member extends upwardly at right angles from said component support surface.

5. A locator device according to claim 4, wherein each component support member is an equilateral triangular block having plate members mounted on adjacent upstanding faces of said triangular block, so that when said support members are in said closed position, said triangular blocks are proximate to one another, and together with said plate members define said component supporting element.

6. A locator device according to claim 5, wherein said triangular blocks are mounted on support arms which are movable towards or away from each other in the manner of a compass.

7. A locator device according to claim 6, wherein said triangular blocks are each pivotably mounted on their respective support arms.

8. A locator device according to claim 7, wherein pivot limiting elements are provided on each support arm adjacent said triangular blocks to limit pivotal movement of said triangular blocks.

9. A locator device according to claim 1, and further including a grounding device for preventing static build-up on said component.

10. A locator device for locating modular electronic components centrally with respect to a nozzle of an apparatus for attaching said components to a substrate, said locator device comprising:
   means for supporting a component and positioning said component centrally within said nozzle, said means for supporting and positioning comprising two triangular shaped surfaces adapted to support said component, said two triangular shaped surfaces having two surfaces extended upwardly and orthogonally with respect to said two triangular shaped surfaces and connected to two sides of said triangular shaped surfaces; and
   two support arms pivotably connected to one another at corresponding first ends thereof, said two support arms each having second ends for pivotably supporting one of said two triangular shaped surfaces, wherein when said two support arms are pivoted into a closed position, said two triangular shaped surfaces are adjacent to one another, said component rests on said two triangular shaped surfaces and abuts against said upwardly extending surfaces, and said upwardly extending surfaces can be inserted into said nozzle such that said upwardly extending surfaces abuts sides of said nozzle, thereby centrally positioning said component within said nozzle.

11. A locator device according to claim 10 wherein said second ends of said two support arms comprise limiting elements for limiting pivoting of said two triangular shaped surfaces.

* * * * *